(12) United States Patent
Motoyoshi

(10) Patent No.: US 10,115,649 B1
(45) Date of Patent: Oct. 30, 2018

(54) EXTERNAL CONNECTION MECHANISM, SEMICONDUCTOR DEVICE, AND STACKED PACKAGE

(71) Applicant: TOHOKU-MICROTEC CO., LTD, Sendai-shi, Miyagi (JP)

(72) Inventor: Makoto Motoyoshi, Miyagi (JP)

(73) Assignee: TOHOKU-MICROTEC CO., LTD., Sendai-shi (JP)

( * ) Notice: Subject to any disclaimer, the term of this patent is extended or adjusted under 35 U.S.C. 154(b) by 0 days.

(21) Appl. No.: 15/849,721

(22) Filed: Dec. 21, 2017

(30) Foreign Application Priority Data

Apr. 28, 2017 (JP) .................. 2017-089870

(51) Int. Cl.
| | | |
|---|---|---|
| H01L 23/485 | (2006.01) | |
| H01L 23/31 | (2006.01) | |
| H01L 21/768 | (2006.01) | |
| H01L 27/06 | (2006.01) | |
| H01L 21/48 | (2006.01) | |
| H01L 23/522 | (2006.01) | |
| H01L 21/02 | (2006.01) | |
| H01L 27/02 | (2006.01) | |
| H01L 23/00 | (2006.01) | |

(52) U.S. Cl.
CPC .... H01L 23/3128 (2013.01); H01L 21/02513 (2013.01); H01L 21/4825 (2013.01); H01L 21/7681 (2013.01); H01L 23/3178 (2013.01); H01L 23/5226 (2013.01); H01L 27/0207 (2013.01); H01L 27/0688 (2013.01); *H01L 21/7685* (2013.01); *H01L 24/14* (2013.01)

(58) Field of Classification Search
CPC ............. H01L 21/7685; H01L 21/4825; H01L 2021/60225; H01L 24/14
USPC .................................................. 257/780
See application file for complete search history.

(56) References Cited

U.S. PATENT DOCUMENTS

| | | | |
|---|---|---|---|
| 9,219,047 B2 * | 12/2015 | Motoyoshi | ............. H01L 24/11 |
| 2002/0014685 A1 * | 2/2002 | Tsukahara | ............... H01L 24/11 257/673 |
| 2005/0098901 A1 | 5/2005 | Chang et al. | |
| 2009/0224402 A1 * | 9/2009 | Do | ........................ H01L 21/568 257/738 |
| 2010/0013094 A1 * | 1/2010 | Jo | ........................ H01L 21/563 257/738 |

(Continued)

FOREIGN PATENT DOCUMENTS

| | | |
|---|---|---|
| JP | 2012-023181 A | 2/2012 |
| WO | 2014/136241 A1 | 9/2014 |

OTHER PUBLICATIONS

An extended European search report (EESR) dated Aug. 1, 2018 in a counterpart European application.

*Primary Examiner* — George Fourson, III
(74) *Attorney, Agent, or Firm* — Metrolexis Law Group, PLLC

(57) ABSTRACT

A semiconductor device encompasses a connecting base including a semiconductor substrate and a surface insulating-film on the semiconductor substrate, a passivation film covering the surface insulating-film and surface electrode on the surface insulating-film, establishing a groove that exposes a central part of the surface electrode, a barrier-metal film spanning from the bottom of the groove to an upper face of the passivation film, and micro-bumps arranged on the barrier-metal film located on the passivation film.

5 Claims, 9 Drawing Sheets

(56) References Cited

U.S. PATENT DOCUMENTS

| | | | |
|---|---|---|---|
| 2011/0278741 A1* | 11/2011 | Chua | H01L 21/561 |
| | | | 257/777 |
| 2012/0104623 A1* | 5/2012 | Pagaila | H01L 23/13 |
| | | | 257/774 |
| 2014/0217610 A1* | 8/2014 | Jeng | H01L 23/3128 |
| | | | 257/774 |
| 2014/0252602 A1* | 9/2014 | Hua | H01L 24/12 |
| | | | 257/737 |
| 2014/0252604 A1 | 9/2014 | Motoyoshi | |
| 2014/0312390 A1 | 10/2014 | Tsai et al. | |
| 2014/0332953 A1 | 11/2014 | Ossimitz et al. | |
| 2017/0062240 A1* | 3/2017 | Wu | H01L 21/4853 |
| 2017/0103957 A1* | 4/2017 | Li | H01L 24/14 |

\* cited by examiner

EXTERNAL CONNECTION MECHANISM, SEMICONDUCTOR DEVICE, AND STACKED PACKAGE

CROSS REFERENCE TO RELATED APPLICATIONS AND INCORPORATION BY REFERENCE

This application claims the benefit of priority from Japanese Patent Application No. 2017-89870, filed on Apr. 28, 2017, the entire contents of which are incorporated herein by reference.

BACKGROUND OF THE INVENTION

1. Field of the Invention

The present invention relates to an external connection mechanism for electrically connecting a semiconductor chip implementing a connecting base to an external circuit (target base) such as an insulated circuit board or an external connection mechanism for electrically connecting semiconductor chips to each other. The present invention also relates to a semiconductor device including the external connection mechanism and the connecting base, and relates to a stacked package including the connecting base and the target base which are connected by the external connection mechanism.

2. Description of the Related Art

JP 2012-023181 A discloses a semiconductor device including a passivation film having a groove exposing an upper face of an electrode delineated on a substrate, a barrier-metal film covering the upper face of the electrode exposed at the bottom of the groove, and a bump electrode provided on the electrode via the barrier-metal film. Such a semiconductor device has an interlayer insulating-layer on which the electrodes are provided, and a main face of the interlayer insulating-layer is generally planarized by chemical mechanical polishing (CMP).

U.S. Pat. No. 9,219,047 discloses a stacked device including a plurality of pyramidal micro-bumps for electrical wiring and using a cone bump for positioning and a corresponding wall pattern to achieve high-precision positioning. The pyramidal micro-bumps makes it possible to save material, easily deform a tip, and reduce variation in connection.

However, when the plurality of micro-bumps disclosed in U.S. Pat. No. 9,219,047 is employed as the bump electrodes disclosed in JP 2012-023181 A, the upper face of the electrode exposed at the bottom of the groove will be roughened through an etching process of the passivation film. If the upper face of the electrode exposed at the bottom of the groove is roughened, a length between a tip of the bump and the substrate may not be uniform. As a result, the fabrication yield of the semiconductor device may decrease.

SUMMARY OF THE INVENTION

A first aspect of the present invention inheres in a semiconductor device encompassing (a) a connecting base including a semiconductor substrate, a surface insulating-film having a flat upper face and provided on the semiconductor substrate, an interconnection buried in the surface insulating-film, and a surface electrode arranged on the upper face of the surface insulating-film and connected to the interconnection, (b) a passivation film covering the upper face of the surface insulating-film and the surface electrode, establishing a groove that exposes a central part of the surface electrode at a bottom, (c) a barrier-metal film spanning from the bottom of the groove to an upper face of the passivation film so as to cover an area corresponding to the surface electrode in a plane pattern, and (d) a plurality of micro-bumps arranged on the barrier-metal film located on the passivation film.

A second aspect of the present invention inheres in a stacked package encompassing (a) a target base having a bottom face on which a wiring land is arranged, (b) a connecting base facing the target base to be electrically connected to the wiring land, the connecting base including a semiconductor substrate, a surface insulating-film having a flat upper face and provided on the semiconductor substrate, an interconnection buried in the surface insulating-film, and a surface electrode arranged on the upper face of the surface insulating-film and connected to the interconnection, (c) a passivation film covering the upper face of the surface insulating-film and the surface electrode, establishing a groove that exposes a central part of the surface electrode at a bottom (d) a barrier-metal film spanning from the bottom of the groove to an upper face of the passivation film so as to cover an area corresponding to the surface electrode in a plane pattern, and (e) a plurality of micro-bumps arranged on the barrier-metal film located on the passivation film, each of the plurality of micro-bumps having a tip contacting with the wiring land.

A third aspect of the present invention inheres in an external connection mechanism provided between a target base and a connecting base, the target base having a bottom face on which a wiring land is arranged, the connecting base facing the target base and including a semiconductor substrate, a surface insulating-film having a flat upper face and provided on the semiconductor substrate, an interconnection buried in the surface insulating-film, and a surface electrode arranged on the upper face of the surface insulating-film and connected to the interconnection, the surface electrode is configured to be electrically connected to the wiring land. The external connection mechanism pertaining to the third aspect of the present invention encompasses (a) a passivation film covering the upper face of the surface insulating-film and the surface electrode, establishing a groove that exposes a central part of the surface electrode at a bottom, (b) a barrier-metal film spanning from the bottom of the groove to an upper face of the passivation film so as to cover an area corresponding to the surface electrode in a plane pattern, and (c) a plurality of micro-bumps arranged on the barrier-metal film located on the passivation film, each of the plurality of micro-bumps having a tip contacting with the wiring land.

DETAILED DESCRIPTION OF THE INVENTION

Exemplary embodiments of the invention will be described below with reference to the drawings. The same or similar reference sings are used to designate the same or similar elements throughout the drawings, and duplicate explanation is omitted. Since the drawings are schematic, a relationship between a thickness and plane dimensions, a ratio of thickness of each layer, and the like may be different from the actual one. Portions having different dimensional relations and ratios may also be included between drawings. The embodiments described hereinafter exemplify devices and methods for embodying the technical idea of the invention, and the technical idea of the invention does not specify the material, shape, structure, or arrangement of the elements described below.

The terms relating to directions, such as "upper," "lower," "top," and "bottom" in the following description will be used for the purpose of explanation and will not limit the technical idea of the invention. For example, when a target having upper and lower ends is rotated by 90 degrees, the upper and lower ends of the target is expressed as left and right ends of the target, respectively. When the target is rotated by 180 degrees, the upper end and the lower end is changed into the lower end and the upper end, respectively.

Semiconductor Device

Figure 1:
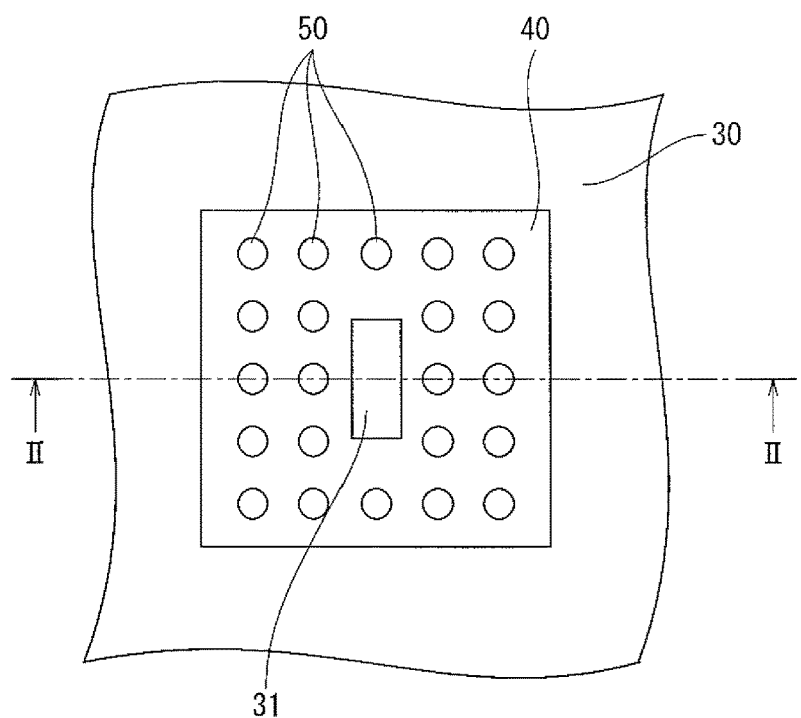
FIG. 1 is a top view of main parts of an external connection mechanism according to an embodiment of the present invention.
Figure 2:
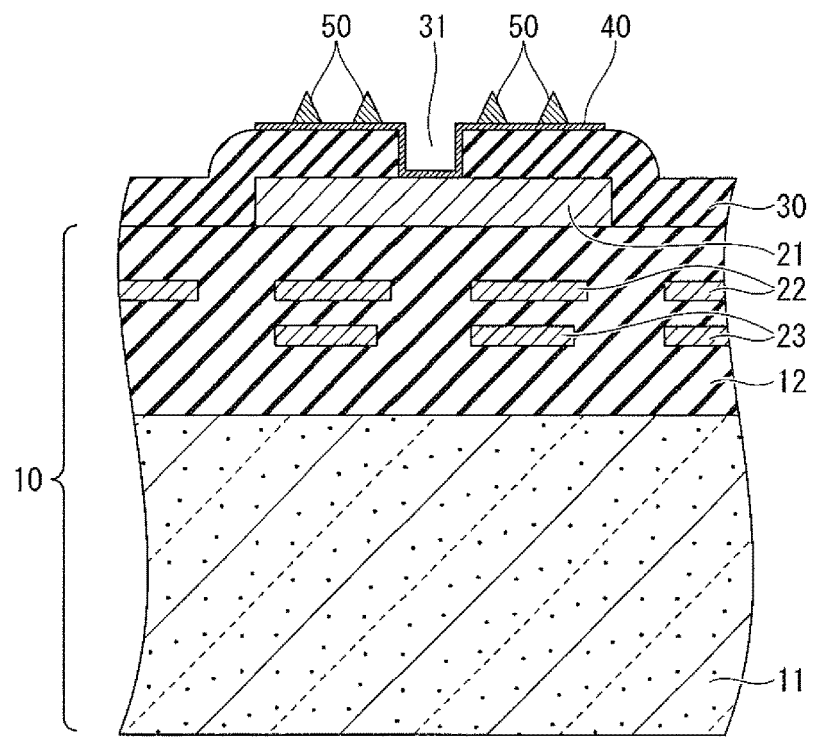
FIG. 2 is a cross-sectional view taken from line II-II of FIG. 1.

As illustrated in FIGS. 1 and 2, a semiconductor device according to an embodiment of the present invention includes a connecting base 10, a passivation film 30, a barrier-metal film 40, and a plurality of micro-bumps 50. The connecting base 10 includes a surface insulating-film 12 and a surface electrode 21 selectively arranged on an upper face of the surface insulating-film 12. The passivation film 30 includes a well-shaped groove 31 exposing a part of an upper face of a central portion of the surface electrode 21 and covering the upper face of the surface insulating-film 12 and a periphery portion of the surface electrode 21 in a region surrounding the groove 31 (i.e., in a region other than the groove 31). The barrier-metal film 40 continuously covers a region between the groove 31 and an upper face of the passivation film 30 such that the occupied area of the barrier-metal film 40 corresponds to an area in a plane pattern of the surface electrode 21. The plurality of micro-bumps 50 is arranged on an upper face of the barrier-metal film 40 on the passivation film 30. The upper face of the surface insulating-film 12 is planarized, and an interconnection (22 and 23) is buried in the surface insulating-film 12. The surface electrode 21 is arranged on the upper face of the surface insulating-film 12 and is connected to the interconnection (22 and 23) in the surface insulating-film 12.

The external connection mechanism implementing the semiconductor device according to the embodiment of the present invention may be used for building up another semiconductor device that, for example, allows connection of a wiring land of a semiconductor chip facing the external connection mechanism or a wiring land of an external circuit such as an interposer or a circuit. Although, in FIGS. 1 and 2, a single configuration of bump-connection structure having one surface electrode 21, one groove 31, one barrier-metal film 40, and the plurality of micro-bumps 50, the bump-connection structure is arranged on the upper face of the barrier-metal film 40, is illustrated for simplicity, the actual external connection mechanism according to the embodiment employs a plurality of bump-connection structures to implement a practical semiconductor device such as a semiconductor integrated circuit (IC) chip (for example, please refer to FIG. 10).

As illustrated in FIG. 2, the connecting base 10 includes, for example, a semiconductor substrate 11, the surface insulating-film 12 arranged on an upper face of the semiconductor substrate 11, and the surface electrode 21 selectively arranged on the upper face of the surface insulating-film 12, which contains multilevel interlayer insulating-films. The upper face of an uppermost layer in the multilevel structure of the surface insulating-film 12 is preferably planarized with high accuracy by CMP. A plurality of lower-level interconnections 23 is arranged below a plurality of intermediate-level interconnections 22 via the interlayer insulating-films to implement the interconnection (22 and 23). Therefore, although the surface insulating-film 12 is illustrated like a single-layer film in FIG. 1 for simplicity, the actual surface insulating-film 12 contains multilevel insulating films having three or more levels of interlayer insulating-films. In a lowermost layer in the multilevel structure of the surface insulating-film 12, a gate oxide film, a field insulating film for device isolation, and the like may be provided.

In the surface insulating-film 12, an inorganic-based insulating layer may be used as an interlayer insulating-film, such as a silicon oxide film ($SiO_2$ film), a silicon nitride film ($Si_3N_4$ film), a phosphosilicate glass film (PSG film), a fluorine-containing oxide film (SiOF film), or a carbon-containing oxide film (SiOC film). An organic-based insulating layer may also be used as the interlayer insulating-film, such as a methyl-containing polysiloxane (SiCOH) film, a hydrogen-containing polysiloxane (HSQ) film, a porous methyl silsesquioxane film, or a polyarylene film. These various interlayer insulating-films may be combined to form a composite surface insulating-film 12 with various multilevel structures.

Each of the intermediate-level interconnection 22 and the lower-level interconnection 23 is made of a metal layer such as aluminum (Al), an aluminum-silicon alloy (Al—Si alloy), an aluminum-copper alloy (Al—Cu alloy), or copper (Cu) damascene. Although the double-level interconnection structure (22 and 23) is illustrated in FIG. 2 for simplicity, multilevel-interconnection structures such as triple-level to twelve-level or thirteen-level, or further more levels structure may actually be adopted according to the design specifications. Each of the intermediate-level interconnection 22 and the lower-level interconnection 23 may be implemented by a laminated structure in which barrier layers made of metal such as titanium (Ti), tantalum (Ta), manganese (Mn), or ruthenium (Ru) are provided as upper and lower layers, instead of a single-layer wiring made of metal such as Al—Cu alloy as described above. For example, a quintuple-level laminated structure having the barrier layers made of TiN/Ti in upper and lower layers, such as TiN/Ti/Al—Cu alloy/TiN/Ti, may be adopted as a specific wiring structure of each of the intermediate-level interconnection 22 and the lower-level interconnection 23.

Assuming that the lower-level interconnection 23 is a first wiring layer, each of the lower-level interconnections 23 and an impurity diffused region buried in a surface portion inside the semiconductor substrate 11 are connected to each other by a via-plug (not illustrated) penetrating through a specific interlayer insulating-film implementing the surface insulating-film 12. The lower-level interconnection 23 may have a composite structure implemented by an impurity-doped polycrystalline-silicon layer or a silicide film of the polycrystalline-silicon layer with refractory metal such as tantalum (Ta), titanium (Ti), tungsten (W) or vanadium (V). The via-plug (contact plug) may be made of refractory metal such as Ta, Ti, W, or V.

For example, if the via-plug is made of tungsten (W), a barrier layer such as TiN/Ti may be provided on a side wall of a via-hole (contact hole) where the via-plug is provided and on the surface of the impurity diffused region of the semiconductor substrate 11. Similarly, the intermediate-level interconnections 22 and the corresponding lower-level interconnections 23 are also connected to each other by a via-plug (not illustrated).

The surface electrode 21 is a metallic film delineated on the upper face of the surface insulating-film 12. The surface electrode 21 has a rectangular plane pattern, for example. The surface electrode 21 is made of Al, Cu or the like. The surface electrode 21 is connected to each of the intermediate-level interconnections 22 by a via-plug (not illustrated), for example. Alternatively, an upper-level interconnection (not illustrated) implementing the upper face of the surface insulating-film 12 may be exposed, and the surface electrode 21 may be arranged on the upper face of the upper-level interconnection (not illustrated). In this structure, the upper-level interconnection (not illustrated) may be connected to the intermediate-level interconnection 22 by a via-plug. For the via-plug connecting between the intermediate-level interconnection 22 and the lower-level interconnection 23 and the via-plug connecting between the surface electrode 21 and the intermediate-level interconnection 22, Cu may be employed in addition to the refractory metal.

The passivation film 30 may be formed by using, for example, an organic-based insulating layers such as an SiCOH film, an HSQ film, a porous methyl silsesquioxane film, or a polyarylene film in addition to an inorganic-based insulating layer such as an $SiO_2$ film, an $Si_3N_4$ film, a PSG film, an SiOF film, or an SiOC film. The passivation film 30 may have a single layer structure or may have various multilayer structures in which the above-described various insulating film layers are combined and stacked.

The passivation film 30 is arranged so as to cover the upper face of the surface insulating-film 12 and the upper face of the surface electrode 21 excluding a central region defined by the well-shaped groove 31. With the structure illustrated in FIG. 2, an inner region of the passivation film 30 covering the fringe of the surface electrode 21 establishes a ring of a mesa-shaped (isolated hill-shaped) plateau, the plateau portion provides a larger height of a level top than the rest of the passivation film 30 with a escarpment. A central part of the surface electrode 21 serves as a bottom of a caldera-shaped depressed configuration (concave configuration), which is surrounded by the ring of the mesa-shaped plateau of the passivation film 30.

The barrier-metal film 40 covers continuously from the upper face of the surface electrode 21, whose central area is partly exposed at the bottom of the groove 31 as the bottom of the caldera-shaped depressed portion, through an inner wall of the groove 31, toward an area on the mesa-shaped portion of the passivation film 30, the mesa-shaped portion is allocated above the surface electrode 21. The plane pattern of the barrier-metal film 40 may be rectangular, for example, as illustrated in FIG. 1. The surface electrode 21 and the plurality of micro-bumps 50 are electrically short-circuited by the barrier-metal film 40.

The barrier-metal film 40 includes at least a barrier layer for preventing a solid-phase diffusion reaction between the metallic elements contained in the surface electrode 21 and the metallic elements contained in the micro-bump 50. The barrier layer is made of a refractory metal such as Ti, Ta, manganese (Mn), ruthenium (Ru), W, or nickel (Ni). The barrier-metal film 40 may have a multilayer structure having another metal layer containing gold (Au) or the like in addition to the barrier layer.

The micro-bump 50 is made of, Au or an alloy containing 80% or more of Au, such as gold-silicon (Au—Si), gold-germanium (Au—Ge), gold-antimony (Au—Sb), gold-tin (Au—Sn), gold-lead (Au—Pb), gold-zinc (Au—Zn), or gold-copper (Au—Cu), for example. Therefore, the micro-bump 50 easily deforms at the time of connection. As illustrated in FIG. 2, each micro-bump 50 has a conical shape having a bottom face connected to the upper face of the barrier-metal film 40.

That is, each micro-bump 50 has a convex shape whose diameter decreases toward the tip (apex). In the embodiment illustrated in FIG. 1, twenty-two micro-bumps 50 are arranged in a two-dimensional matrix on the upper face of the barrier-metal film 40 excluding an area at the bottom of the groove 31.

Figure 3:
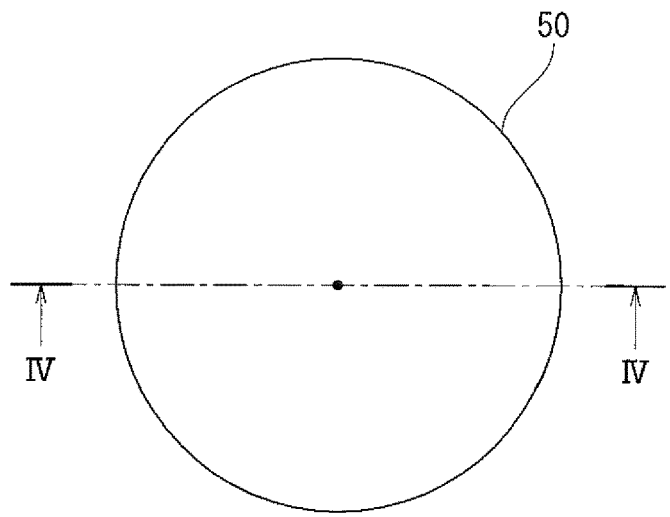
FIG. 3 is a top view of an example of a bump of the external connection mechanism according to the embodiment of the present invention.
Figure 4:
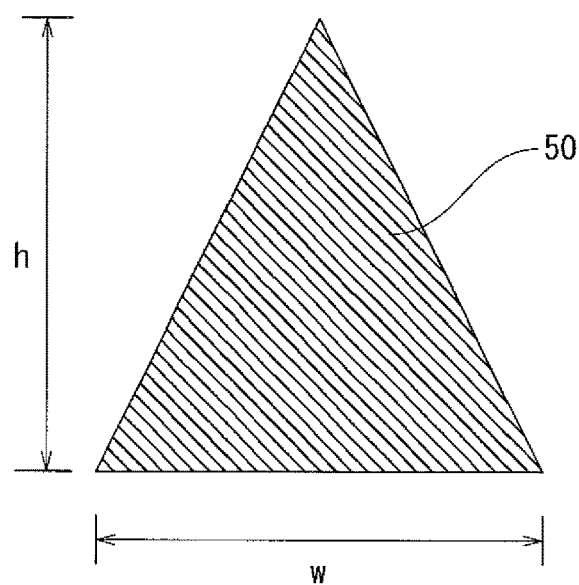
FIG. 4 is a cross-sectional view taken from line IV-IV of FIG. 3.

More specifically, as illustrated in FIGS. 3 and 4, each of the micro-bumps 50 is conical in shape with a height h and a diameter w of several micro meters, for example. For example, the height h is 2·five micro meters, and the diameter w is 2·five micro meters. The micro-bumps 50 are arranged, for example, in a two-dimensional matrix at a constant pitch on the upper face of the barrier-metal film 40 excluding the area at the bottom of the groove 31.

The pitch between the micro-bumps 50 is, for example, ten micro meters or less. The number of micro-bumps 50 arranged on a single barrier-metal film 40 is not limited to twenty-two, and various values may be selected according to design specifications. The micro-bumps 50 are not necessarily arranged in a two-dimensional matrix as long as the pitch is preferably ten micro meters or less. The pitch between the micro-bumps 50 is more preferably five micro meters or less, and the diameter w is preferably ½ of the pitch. For example, when the pitch is two micro meters, the diameter w is preferably one micro meter.

In view of photolithography technique, generally, the upper face of the uppermost layer of the surface insulating-film 12 is planarized by CMP or the like with high accuracy. Therefore, the surface of the surface electrode 21 on the upper face of the surface insulating-film 12 is also planarized with high accuracy. The surface of the passivation film 30 on the surface electrode 21 is also planarized with high accuracy. However, the passivation film 30 is selectively removed by dry etching such as reactive ion etching (RIE) by using an etching mask formed by the photolithography technique to form a micro groove.

With this process, the surface of the surface electrode 21 whose central area is partly exposed at the bottom of the groove is roughened by the dry etching. That is, the upper face of the barrier-metal film 40 as the bottom region of the caldera corresponding to the bottom of the groove 31 is rougher than the upper face implementing the level top of the mesa-shaped configuration by the passivation film 30. For this reason, when the plurality of micro-bumps 50 is arranged in the caldera-shaped bottom region, there is variation in length between a tip of each of the plurality of micro-bumps 50 and a reference plane as a horizontal plane of the connecting base 10 even if the plurality of micro-bumps 50 is designed to have the same height.

In the semiconductor device according to the embodiment of the present invention, the plurality of micro-bumps 50 is scheduled to be assembled in a stacked package such that the plurality of micro-bumps 50 is pressed against a circuit connection target such as wiring lands of another IC chip. At the time of assembling process, the tip of the micro-bump 50 is deformed. As described above, the upper face of the surface insulating-film 12 of the semiconductor device according to the embodiment of the present invention is planarized by CMP with high accuracy, and the passivation film 30 provided on the upper face of the surface insulating-film 12 through the surface electrode 21 also has a flat upper face. Therefore, the upper face of the barrier-metal film 40 provided on the mesa-shaped plateau of the passivation film 30 is also flat.

With this structure, at the time of assembling process, the tip of the micro-bump 50 is deformed to have face-to-face contact with the circuit connection target, and thus, the length between the tip of each micro-bump 50 and the reference plane is constant, which makes it possible to reduce the variations in connection. The micro-bumps 50 are pressed to be firmly bonded to the circuit connection target by heating and applying ultrasonic waves while being pressed against the circuit connection target. Since the length between the tip of each micro-bump 50 and the reference plane is constant, it is possible to reduce the variations in connection of the micro-bumps 50.

As an example, when contact resistance at the time of connection is measured by using a conical micro-bump 50 made of Au and having a height h of 2.5 micro meters and a diameter w of 2.5 micro meters, the contact resistance per unit is about 0.3 ohm. Therefore, by arranging a large number of the micro-bumps 50, the contact resistance can be reduced enough for practical use. In addition, by adopting the conical micro-bump 50, it is possible to reduce the amount of expensive material such as Au, thereby reducing the manufacturing cost.

In the external connection mechanism according to the embodiment of the present invention, the plurality of micro-bumps 50 are arranged on the upper face of the barrier-metal film 40 excluding the area corresponding to the groove 31 of the passivation film 30. That is, the plurality of micro-bumps 50 are arranged in a flat region on the passivation film 30 on the upper face of the barrier-metal film 40.

As described above, the upper face of the barrier-metal film 40 on the mesa-shaped plateau of the passivation film 30 is flat as compared with the upper face of the barrier-metal film 40 at the bottom of the caldera in the groove 31. With the structure illustrated in FIG. 2, the length between the tip of each of the plurality of micro-bumps 50 and the reference plane as the horizontal plane of the connecting base 10 is equal to one another, thereby improving the fabrication yield.

As an additional option, in the external connection mechanism according to the embodiment of the present invention, the micro-bumps 50 may be arranged on the barrier-metal film 40 at the bottom of the caldera in the groove 31. However, if the micro-bumps 50 are arranged on the bottom of the caldera, the heights of the micro-bumps 50 need to be larger than the thickness of the passivation film 30 so that the micro-bumps can be connected to the circuit connection target at the tip.

In this regard, according to the basic technical feature of the external connection mechanism according to the embodiment, the micro-bumps 50 are arranged on the mesa-shaped plateau of the passivation film 30 through the barrier-metal film 40. In accordance with the basic technical feature illustrated in FIG. 2, the heights of the micro-bumps 50 do not need to be larger than the thickness of the passivation film 30, thereby providing small-sized bumps.

In addition, according to the external connection mechanism of the embodiment, since the micro-bump 50 has a micro conical shape, the tip of the micro-bump 50 is easily deformed by being pressed against the circuit connection target through compression bonding to achieve a face-to-face contact with the circuit connection target. Therefore, the external connection mechanism according to the embodiment can further reduce process variations in connection.

Method for Forming Micro-Bumps

A method for forming micro-bumps adapted for an external connection mechanism according to the embodiment of the present invention will be explained, with reference to FIGS. 5 to 7. First, the uppermost layer in the multilevel structure of the surface insulating-film 12 is deposited by chemical vapor deposition (CVD) or the like, and the uppermost layer of the surface insulating-film 12 is planarized by CMP or the like. Next, a metallic layer made of Al—Si alloy or the like is deposited on the upper face of the uppermost layer of the flat surface insulating-film 12 by vacuum evaporation, sputtering, or the like. Then, a photo-resist film for metallization is coated on the metallic layer, and the photo-resist film for metallization is delineated by a photolithography technique to form a mask for metallization. By using the mask for metallization, the metallic layer is selectively etched by dry etching such as RIE or the like to form a pattern of the surface electrode 21.

After removing the mask for metallization, a passivation film 30 is deposited on the upper face of the surface insulating-film 12 on which the surface electrode 21 is arranged by CVD or the like. Then, a photo-resist film for contact hole cutting is coated on the passivation film 30, and the photo-resist film for contact hole cutting is delineated by a photolithography technique to form a mask for contact hole cutting. By using the mask for contact hole cutting, the passivation film 30 is selectively etched by dry etching such as RIE or the like to form a groove 31 exposing a part of the upper face of the surface electrode 21.

After removing the mask for contact hole cutting, a metallic multilayer film made of Ti, TiN, Al—Cu alloy, Ti, TiN, or the like is continuously deposited in vacuum by vacuum evaporation or sputtering. Then, a photo-resist film for barrier metal is coated on the metallic multilayer film, and the photo-resist film for barrier metal is delineated by a photolithography technique to form a mask for barrier metal. By using the mask for barrier metal, the metallic multilayer film is selectively etched by dry etching such as RIE or the like to form a pattern of the barrier-metal film 40.

Figure 5:
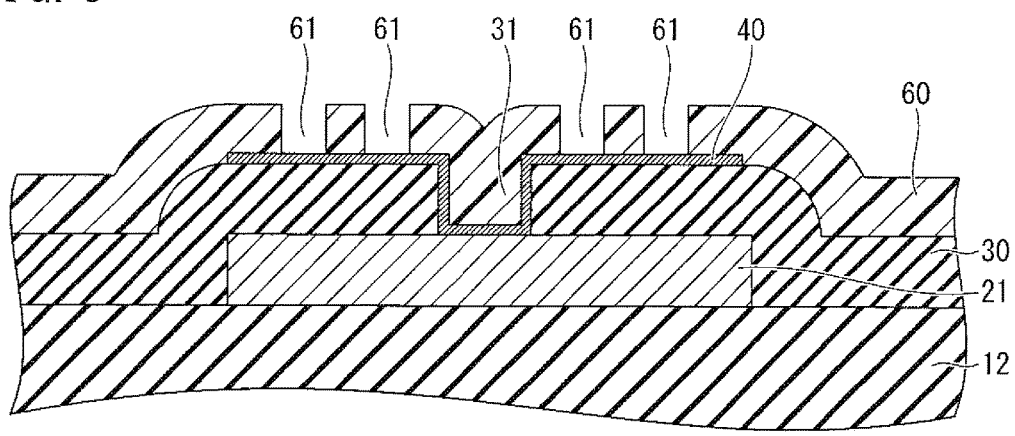
FIG. 5 is an enlarged cross-sectional view illustrating a step of a method for forming an external connection mechanism according to the embodiment of the present invention.

Next, as illustrated in FIG. 5, a photo-resist film 60 for bump formation is coated on the entire surface of the upper face of the passivation film 30 on which the delineated barrier-metal film 40 is arranged. Then, a plurality of circular micro-bump windows 61 are formed in the photo-resist film 60 for bump formation by a photolithography technique. The plurality of micro-bump windows 61 is circularly opened in the photo-resist film 60 for bump formation so as to expose the upper face of the barrier-metal film 40 on the passivation film 30. The plurality of opened micro-bump windows 61 corresponds to a plurality of regions where the micro-bumps 50 are to be formed. The micro-bump windows 61 have a plane pattern of circles with the same size. For example, if the micro-bump 50 has a conical shape having a circular bottom face with a diameter w, the plane pattern of each of the micro-bump windows 61 is a circle with a diameter w.

Figure 6:
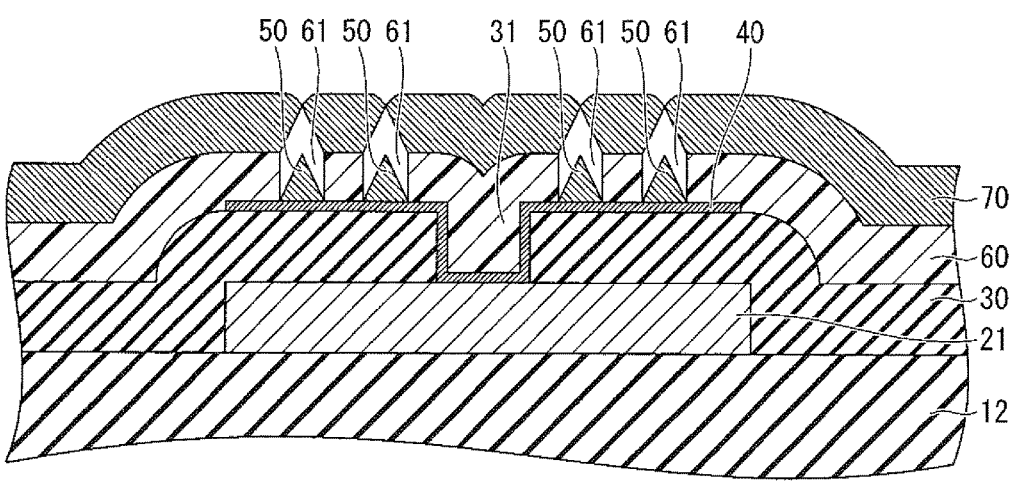
FIG. 6 is an enlarged cross-sectional view illustrating a next step after the previous step illustrated in FIG. 5.

Next, as illustrated in FIG. 6, by using the photo-resist film 60 for bump formation as a mask for bump formation, nano-sized metallic particles together with an inert gas such as helium (He) are ejected on the upper face of the barrier-metal film 40 exposed by the micro-bump window 61 by a gas deposition method. Nano-sized particles of Au or an alloy containing 80% or more of Au can be adopted as the nano-sized metallic particles. By ejecting the nano-sized metallic particles through "gas deposition method" from above the photo-resist film 60 for bump formation, the metallic film is deposited in the micro-bump window 61. By the gas deposition method, the nano-sized metallic particles, which are evaporated from a high-temperature crucible, are ejected together with the inert gas under reduced pressure.

At the same time, however, the metallic film 70 is also deposited on the photo-resist film 60 for bump formation around the micro-bump window 61. Therefore, as illustrated in FIG. 6, eave (overhang) projecting over the micro-bump window 61 from the surrounding photo-resist film 60 for bump formation starts to extend toward the inside of the circle. As the eave extends beyond the inner wall of the circle, the diameter of the circular window is gradually decreased, and eventually, the window is closed. As a result, the metallic micro-bumps 50 having a conical shape with the same size are formed in the circular windows, respectively. The metallic micro-bumps 50 protrude respectively from each of the bottoms of the micro-bump windows 61 by self-generation.

Figure 7:
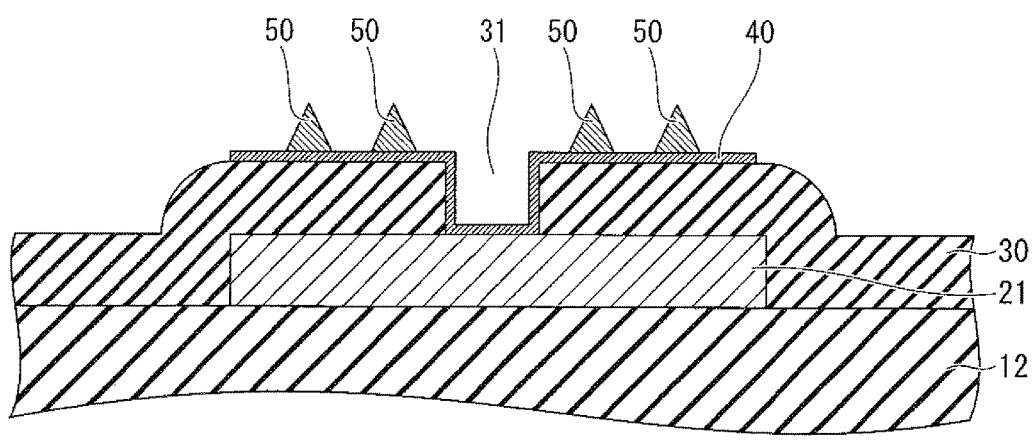
FIG. 7 is an enlarged cross-sectional view illustrating a next step after the previous step illustrated in FIG. 6.

After that, when the photo-resist film 60 for bump formation and the metallic film 70 deposited on the photo-resist film 60 for bump formation are removed, as illustrated in FIG. 7, the pattern of the plurality of micro-bumps 50 made of Au or Au alloy is created. The metallic film deposited on the photo-resist film 60 for bump formation can be reused.

As described above, by depositing the metallic particles by the gas deposition method with the same patterns of the micro-bump windows 61 of the photo-resist film 60 for bump formation, a plurality of conical micro-bumps 50 having the same shape can be formed with high accuracy.

Figure 8:
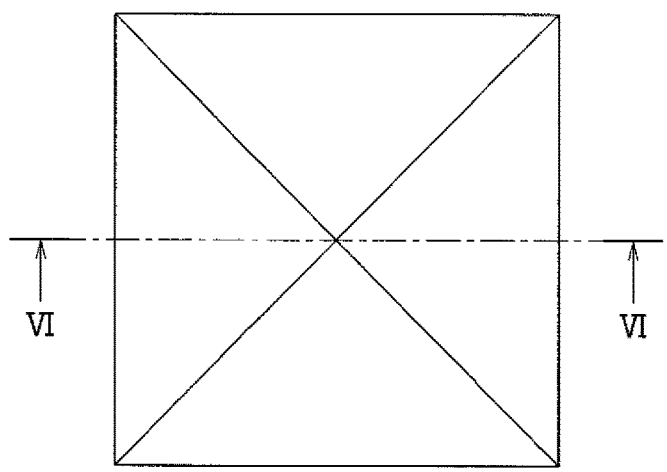
FIG. 8 is a top view of another example of the bump of the external connection mechanism according to the embodiment of the present invention.
Figure 9:
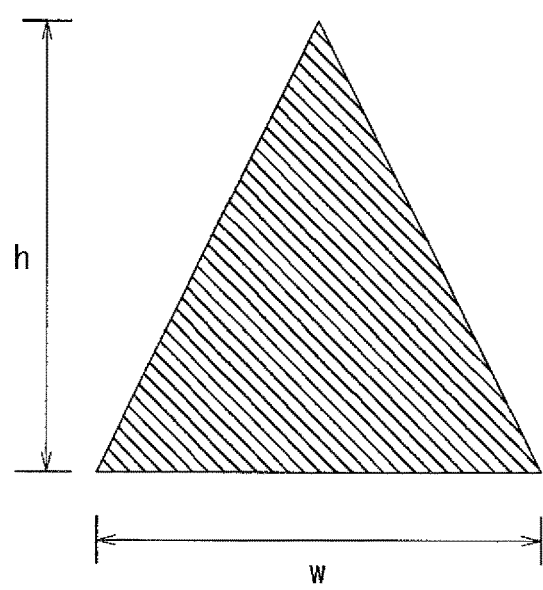
FIG. 9 is a cross-sectional view taken from line IX-IX of FIG. 8.

The shape of the micro-bump 50 is not limited to a conical shape, and a pyramidal shape may be employed. For example, as illustrated in FIGS. 8 and 9, if the micro-bump 50 has a quadrangular pyramidal shape having a square bottom face with a length w of one side, the plane pattern of the micro-bump window 61 in the photo-resist film 60 for bump formation is a square with a length w of one side. With this structure, metallic particles are deposited on the square exposed region of the upper face of the barrier-metal film 40, and the diagonal length of the square groove is gradually decreased as the eaves extend from the photo-resist film 60 for bump formation on the four sides of the micro-bump window 61, so that the micro-bumps 50 having a quadrangular pyramidal shape are formed in a self-generated manner.

Stacked Package

Figure 10:
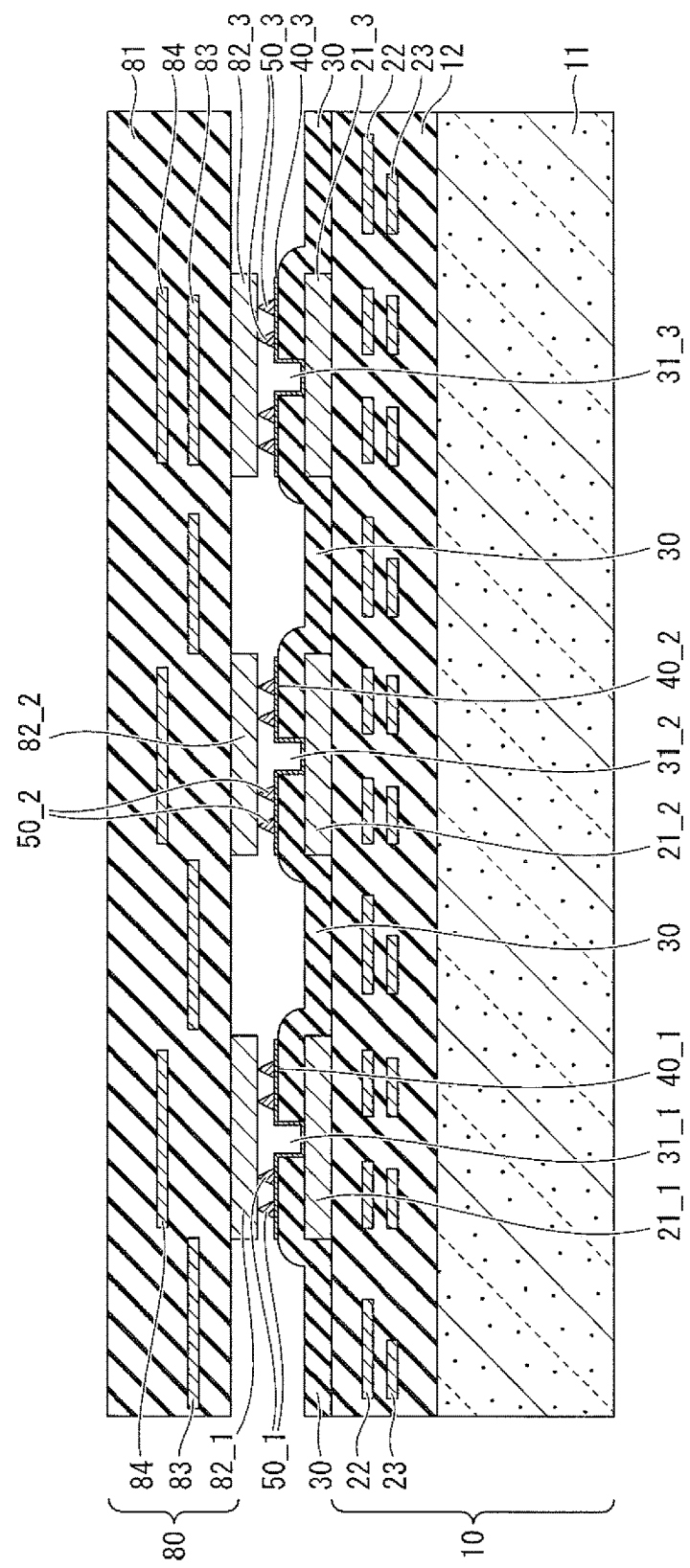
FIG. 10 is a cross-sectional view illustrating a three-dimensional integrated circuit having an external connection mechanism according to the embodiment of the present invention.

As illustrated in FIG. 10, a stacked package according to the embodiment of the present invention includes the connecting base 10 and a target base 80 facing each other, for example. By stacking the connecting base 10 and the target base 80, circuit elements of the connecting base 10 are connected to circuit elements of the target base 80. The target base 80 is an interposer including, for example, an insulated circuit substrate 81, a plurality of wiring lands 82_1, 82_2, and 82_3 arranged on a bottom face of the insulated circuit substrate 81. The interposer as the target base 80 further includes upper-level inner wirings 83 buried in the inside of the insulated circuit substrate 81, and lower-level inner wirings 84 arranged above the upper-level inner wirings 83, through an insulating film implementing the multi-level structure of the insulated circuit substrate 81.

Although the insulated circuit substrate 81 is shown like a single-layered structure in FIG. 10, the actual structure of the insulated circuit board is implemented by a multilayer insulating film having three or more insulating layers. Although the double-level inner interconnections are illustrated in FIG. 10 for simplicity, multilevel inner interconnections containing triple or more levels may actually be adopted according to the design specifications of the interposer. That is, ordinary, the upper-level inner wirings 83 and the lower-level inner wirings 84 shall be defined upside down so that the wiring lands 82_1, 82_2, and 82_3 are taken on the top side.

Similar to the configuration illustrated in FIG. 2, the connecting base 10 implementing the stacked package according to the embodiment illustrated in FIG. 10 includes the surface insulating-film 12 arranged on an upper face of the semiconductor substrate 11, and the passivation film 30 is laminated on the surface insulating-film 12. And, the connecting base 10 has a plurality of surface electrodes 21_1, 21_2, and 21_3 arranged separately from one another on the top face of the connecting base 10. Therefore, the passivation film 30 has a plurality of grooves 31_1, 31_2, and 31_3 which expose parts of the upper faces of the surface electrodes 21_1, 21_2, and 21_3, respectively at the bottoms, and covers the top face of the connecting base 10 and the surface electrodes 21_1, 21_2, and 21_3.

Regions from the caldera-shaped depressed portions where the central areas of the surface electrodes 21_1, 21_2, and 21_3 are partly exposed at the bottom of the grooves 31_1, 31_2, and 31_3, respectively, to the upper face of the passivation film 30 are covered with the plurality of barrier-metal films 40_1, 40_2, and 40_3 along the caldera-shaped depressed configuration. On the upper faces of the barrier-metal film 40_1, 40_2, and 40_3 on the upper face of the mesa-shaped passivation film 30, a plurality of micro-bumps 50_1, a plurality of micro-bumps 50_2, and a plurality of micro-bumps 50_3 are arranged, respectively.

Suppose that the plurality of micro-bumps 50_1 on the barrier-metal film 40_1 is defined as a first group, the plurality of micro-bumps 50_2 on the barrier-metal film 40_2 is defined as a second group, and the plurality of micro-bumps 50_3 on the barrier-metal film 40_3 is defined as a third group, the wiring lands 82_1, 82_2, and 82_3 are assigned correspondingly to the first group, the second group, and the third group, respectively.

That is, when the micro-bumps 50_1, 50_2, and 50_3 are arranged widely on the upper faces of the barrier-metal films 40_1, 40_2, and 40_3, respectively, each of the wiring lands 82_1, 82_2, and 82_3 may share the same plane patterns at the same horizontal level with the barrier-metal films 40_1, 40_2, and 40_3, respectively. The wiring lands 82_1, 82_2 and 82_3 are connection-target electrodes to which the micro-bumps 50_1, 50_2, and 50_3 are connected, respectively. The wiring lands 82_1, 82_2, and 82_3 are made of Au or an alloy containing 80% or more of Au, such as Au—Si, Au—Ge, Au—Sb, Au—Sn, Au—Pb, Au—Zn, or Au—Cu. A multilayer structure using a metallic layer made of Ni or the like as a base may be employed. Alternatively, each of the wiring lands 82_1, 82_2 and 82_3 may optionally have a group of circular patterns corresponding to the micro-bumps 50_1, 50_2, and 50_3.

The wiring lands 82_1, 82_2, and 82_3 on the target base 80 are internally connected to the upper-level inner wirings 83 in the insulated circuit substrate 81 by via-plugs (not illustrated) or the like. Alternatively, additional surface wirings (not illustrated) may be delineated on the bottom face of the insulated circuit substrate 81, and the surface wirings may be directly connected to the corresponding wiring lands 82_1, 82_2 and 82_3, respectively, at the upper face side of the surface wirings (not illustrated). When the surface wirings are delineated on the bottom face of the insulated circuit substrate 81, the surface wirings may be connected to the corresponding upper-level inner wirings 83 by via-plugs respectively (not illustrated). The upper-level inner wirings 83 and the corresponding lower-level inner wirings 84 are also connected to each other by via-plugs respectively (not illustrated).

The plurality of micro-bumps 50_1, 50_2, and 50_3 is connected to the wiring lands 82_1, 82_2 and 82_3, respectively so that the surface electrodes 21_1, 21_2, and 21_3 and the wiring lands 82_1, 82_2 and 82_3 are electrically short-circuited. More specifically, the top face of the connecting base 10 and the bottom face of the insulated circuit substrate 81 face each other in parallel such that the micro-bumps 50_1, 50_2, and 50_3 mate to the corresponding wiring lands 82_1, 82_2, and 82_3, respectively, and heat or ultrasonic energy is applied to the micro-bumps and the wiring lands while pressurizing each other. As a result, the tips of the micro-bumps 50_1, 50_2, and 50_3 are easily deformed to achieve compression bonding by face-to-face contact with the bottom faces of the wiring lands 82_1, 82_2 and 82_3.

As described above, the upper face of the uppermost layer of the surface insulating-film 12 implementing the connecting base 10 is planarized by CMP with high accuracy, and the surface electrode 21_1, 21_2, and 21_3 delineated on the upper face of the uppermost layer of the surface insulating-film 12 and the passivation film 30 covering the upper faces of the surface electrodes 21_1, 21_2, and 21_3 have flat upper faces whose surface levels are coincident with one another. According to the external connection mechanism of the embodiment, on the mesa-shaped plateau surrounding the caldera-shaped depressed regions where the surface electrodes 21_1, 21_2, and 21_3 are roughened by dry etching, the plurality of micro-bumps 50_1, 50_2, and 50_3 is formed on the upper faces of the barrier-metal films 40_1, 40_2, and 40_3, respectively. With the structure according to the embodiment of the present invention, the lengths between each tip of the plurality of micro-bumps 50_1, 50_2, and 50_3 and the horizontal level arbitrarily, which is set in the connecting base 10, are uniform. Therefore, because the variations in connection with the wiring lands 82_1, 82_2, and 82_3 are reduced, the structure according to the embodiment of the present invention can improve the fabrication yield.

First Modified Example

In the above-described embodiment, twenty-two micro-bumps 50 are arranged two-dimensionally on the upper face of one barrier-metal film 40. However, as illustrated in FIGS. 11 and 12, the micro-bumps 50a may be arranged one-dimensionally according to the request of the design specification.

Figure 11:
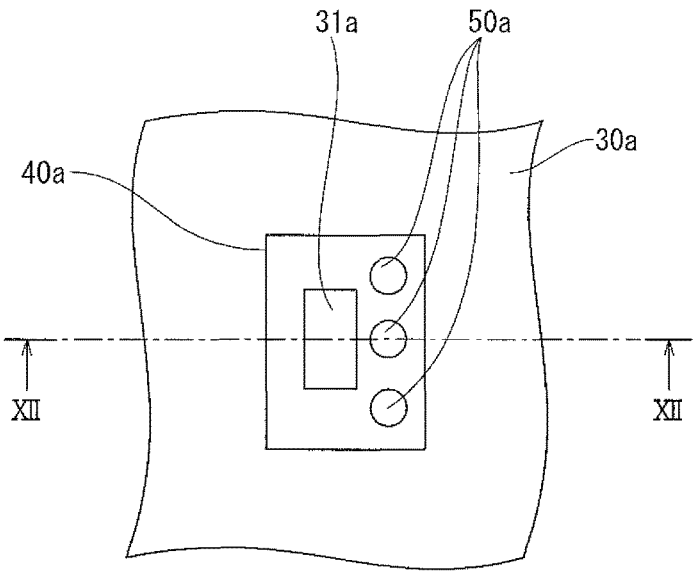
FIG. 11 is a top view of an external connection mechanism according to a first Modified Example of the embodiment of the present invention.
Figure 12:
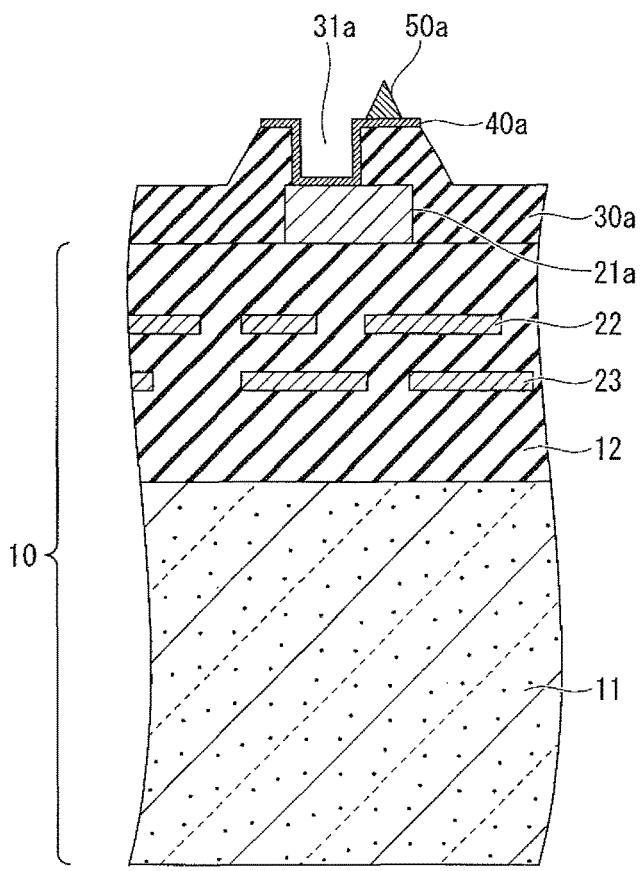
FIG. 12 is a cross-sectional view taken from line XII-XII of FIG. 11.

As illustrated in FIGS. 11 and 12, the external connection mechanism according to a first Modified Example of the embodiment has a small area ratio of the surface electrode 21a to the groove 31a exposing a part of the upper face of the surface electrode 21a, on a plane pattern. Therefore, as compared with the structure of the embodiments illustrated in FIGS. 1 to 10, the area where the barrier-metal film 40a can be arranged on the surface electrode 21a and the passivation film 30a is small. As illustrated in FIG. 11, when the barrier-metal film 40a has a smaller asset area, by providing the groove 31a close to one side of the surface electrode 21a, the plurality of micro-bumps 50a can be arranged side by side in a line on the upper face of the barrier-metal film 40a located on the mesa-shaped plateau of the passivation film 30a on the surface electrode 21a.

In FIGS. 11 and 12, a bump-connection structure including one surface electrode 21a, one groove 31a, one barrier-metal film 40a, and the plurality of micro-bumps 50a arranged on the upper face of the barrier-metal film 40a is illustrated, in comparison with the embodiments illustrated in FIGS. 1 to 10. However, the actual external connection mechanism according to the first Modified Example of the embodiment has a plurality of bump-connection structure. As described above, the horizontal level of the upper face of the mesa-shaped passivation film 30 on the surface electrode 21a is coincident with the horizontal levels of the upper face of the mesa-shaped passivation film 30 on another surface electrodes, and the upper faces of the mesa-shaped passivation film 30 are flat. With the structure illustrated in FIGS. 11 and 12, the length between each tip of the plurality of micro-bumps 50a and the horizontal level arbitrarily set as a criterion in the connecting base 10 is uniform, and the variations in connection with the circuit connection target is reduced, thereby improving the fabrication yield.

Second Modified Example

Figure 13:
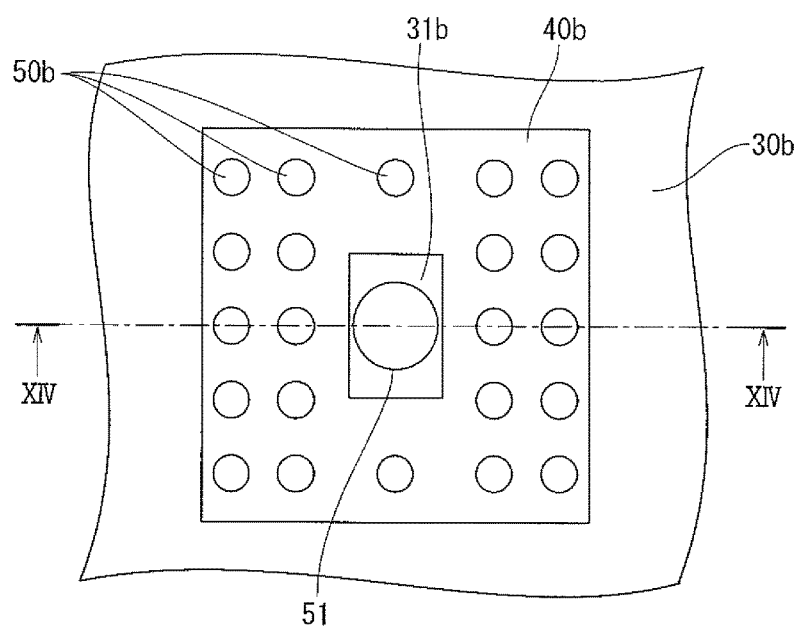
FIG. 13 is a top view of an external connection mechanism according to a second Modified Example of the embodiment of the present invention.
Figure 14:
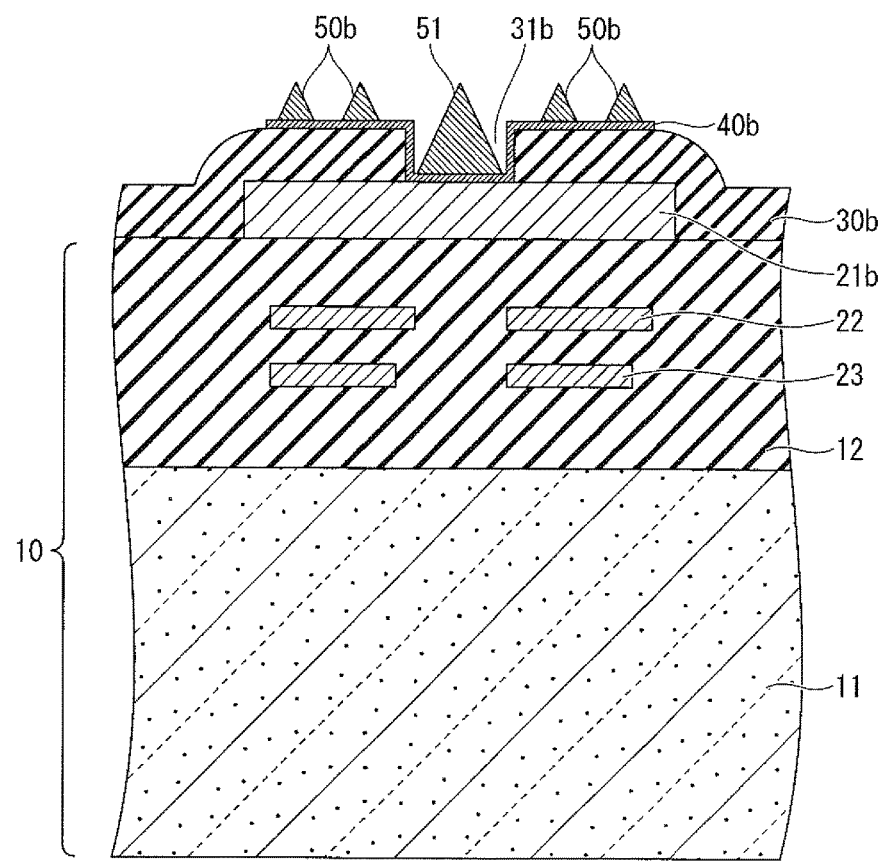
FIG. 14 is a cross-sectional view taken from line XIV-XIV of FIG. 13.

As illustrated in FIGS. 13 and 14, an auxiliary bump 51 having a conical shape may be arranged on an upper face of a barrier-metal film 40b, which is inside a groove 31b, in contrast to the external connection mechanism according to the embodiments illustrated in FIGS. 1 to 10. The auxiliary bump 51 is larger than each micro-bump 50b arranged on the upper face of the barrier-metal film 40b on a passivation film 30b on a surface electrode 21b. The length between a tip of the auxiliary bump 51 and a reference plane as a horizontal plane of the connecting base 10 is substantially equal to the length between a tip of each micro-bump 50b and the reference plane.

Although a single auxiliary bump 51 is illustrated in FIGS. 13 and 14, a plurality of auxiliary bumps 51 may be provided. Preferably, however, the number of the auxiliary bumps 51 is smaller than the number of the micro-bumps 50b from the viewpoint of material cost and variation in height between the micro-bump 50b and the auxiliary bump 51. Since the auxiliary bump 51 has a conical shape similarly to the micro-bumps 50b, the auxiliary bump is easily deformed by being pressed against the circuit connection target, which makes it possible for the auxiliary bump together with the micro-bumps 50b to reduce the variations in connection.

Figure 15:
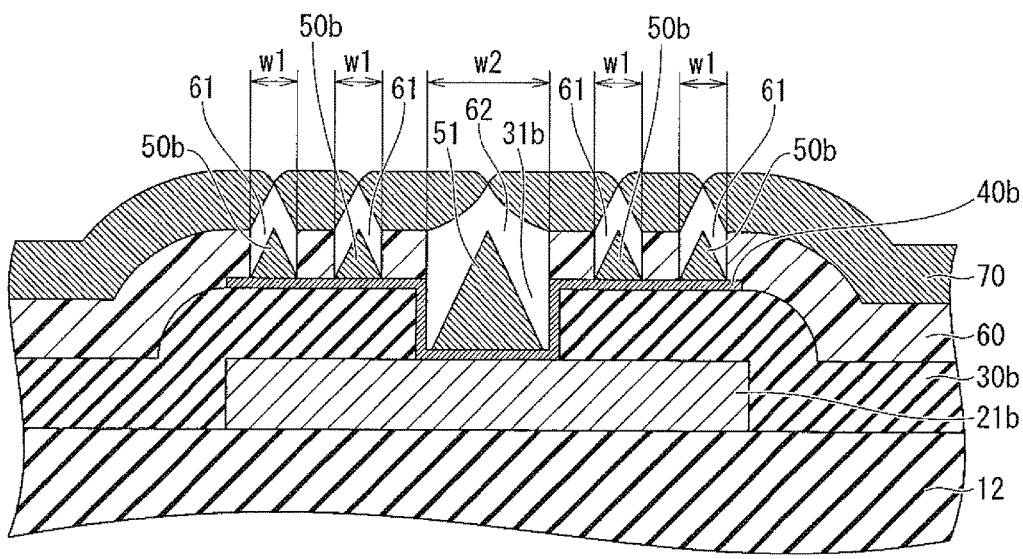
FIG. 15 is a cross-sectional view illustrating a step of a method for forming an external connection mechanism according to the second Modified Example of the embodiment of the present invention.

A method for forming the auxiliary bump 51 will be described with reference to FIG. 15. First, as in the embodiment illustrated in FIG. 5, after the barrier-metal film 40b is formed, the photo-resist film 60 for bump formation is coated on the entire surface of the passivation film 30. By using a mask delineated by a photolithography technique, the micro-bump windows 61 and auxiliary windows 62 exposing the upper face of the barrier-metal film 40b are cut in the photo-resist film 60 for bump formation, correspondingly to regions where the micro-bumps 50b and the auxiliary bumps 51 are to be formed. The diameter w2 of the auxiliary window 62 is larger than the diameter w1 of the micro-bump window 61. The auxiliary window 62 is cut so as to expose the upper face of the barrier-metal film 40b located in the groove 31b.

Next, by using the photo-resist film 60 for bump formation as a mask for bump formation, nano-sized metallic particles together with an inert gas such as helium (He) are ejected, by a gas deposition method, on the upper face of the barrier-metal film 40b exposed by the micro-bump windows 61 and the auxiliary window 62. The nanosized particles of Au or an Au alloy can be adopted as the nano-sized metallic particles. By ejecting the nanosized metallic particles evaporated from a high-temperature crucible together with the inert gas under reduced pressure by the gas deposition method from above the photo-resist film 60 for bump formation, the metal is deposited in the micro-bump windows 61 and the auxiliary window 62.

At the same time, the metallic film 70 is also deposited from the surroundings of the micro-bump windows 61 and the auxiliary window 62, and thus, eaves covering the micro-bump windows 61 and the auxiliary window 62 are generated. As the eaves are generated, the groove diameter of each of the windows is gradually decreased, and eventually, the windows are closed. As a result, metallic micro-bumps 50b with the same size and the auxiliary bumps 51, each having a protrusion of a conical shape, are formed in the windows in a self-generated manner. The tips of the micro-bumps 50b and the auxiliary bumps 51 as apexes of the cones are formed at centers of the micro-bump windows 61 and the auxiliary windows 62.

Since the diameter w2 of the auxiliary window 62 is larger than the diameter w1 of the micro-bump window 61, the time when the auxiliary window 62 is closed by the eave is later than the time when the micro-bump window 61 is closed. For this reason, a larger amount of metal is accumulated in the auxiliary window 62 than the micro-bump window 61, and the auxiliary bump 51 having larger diameter and height than those of the micro-bumps 50b is formed. Therefore, by considering a relative size between the micro-bump window 61 and the auxiliary window 62 in the photo-resist film 60 for bump formation, the length between the tip of the micro-bump 50b and the horizontal level arbitrarily set as a criterion in the connecting base 10 can be equal to the length between the tip of the auxiliary bump 51 and the horizontal level.

Finally, by removing the photo-resist film 60 for bump formation and the metallic film 70 deposited on the photo-resist film 60 for bump formation, patterns of the plurality of micro-bumps 50b and auxiliary bumps 51 made of Au or an Au alloy are generated. As described above, it is possible to provide the micro-bump 50b and the auxiliary bump 51 so as to share the same height between the tip thereof and the horizontal level arbitrarily set as a criterion in the connecting base 10.

As described above, the upper face of the barrier-metal film 40b located on the bottom of the caldera in the groove 31 is roughened because the surface of the surface electrode 21b is roughened during dry etching of the passivation film 30. If the bottom of the caldera is roughened, the length between the tip of each micro-bump 50b and the reference plane as the horizontal plane of the connecting base 10 may be different from the length between the tip of the auxiliary bump 51 and the reference plane. However, since each of the micro-bumps 50b and the auxiliary bumps 51 has a conical shape, the tips thereof can be easily deformed, which makes it possible to reduce the variations in connection.

Since the auxiliary bump 51 is arranged on the upper face of the surface electrode 21b through the barrier-metal film 40b, it is possible to further reduce the contact resistance between the surface electrode 21b and the circuit connection target, by using the auxiliary bump 51 as well as the plurality of micro-bumps 50b.

OTHER EMBODIMENTS

Although the embodiments of the invention have been described above, it should not be understood that the description and drawings implementing a part of this disclosure limit the invention. From this disclosure, various alternative embodiments, examples, and operational techniques will be apparent to those skilled in the art.

For example, in the embodiment illustrated in FIG. 10, the external connection mechanisms are arranged on the connecting base 10 implemented by a semiconductor chip such as the semiconductor chip and the target base 80 implemented by a circuit connection target to which the external connection mechanism is connected has been treated as the interposer.

However, the external connection mechanism may be stacked on a plurality of other semiconductor chips to form a multi-level stacked structure, thereby implementing a three-dimensional integrated circuit (IC). The bump-connection structure of the external connection mechanism may also be applied to the interposer side by using the wiring lands of the interposer as the surface electrodes 21.

In the embodiments illustrated in FIGS. 1 to 10, because an area of the barrier-metal film 40 disposed on the mesa-shaped plateau of the passivation film 30 corresponds to the surface electrode 21, the micro-bumps 50 are arranged on the upper face of the barrier-metal film 40 on the upper face of the passivation film 30 forming the mesa-shaped plateau on the upper side of the surface electrode 21. However, if the passivation film 30 is thicker than the surface electrode 21 and planarized by CMP or the like to lose a topology of the mesa-shaped plateau, the area of the barrier-metal film 40 in the plane pattern needs not to correspond to the surface electrode 21.

Figure 16:
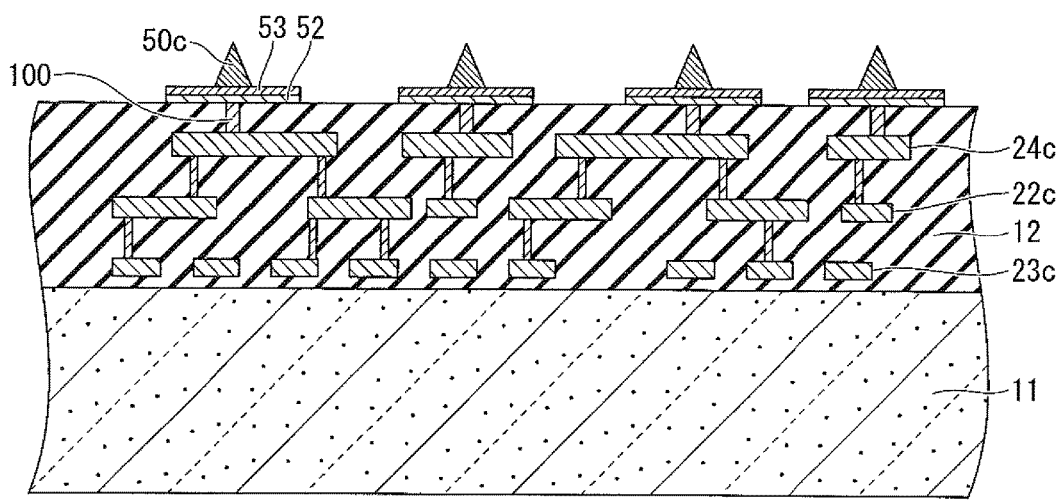
FIG. 16 is a cross-sectional view of a semiconductor device according to another embodiment of the present invention.

In one of the other embodiments of the present invention, a tungsten plug 100 can be buried in the uppermost layer in the multi-level structure of the surface insulating-film 12 as illustrated in FIG. 16. In FIG. 16, lower-level interconnections 23c, intermediate-level interconnections 22c, and upper-level interconnections 24c are buried in the surface insulating-film 12 to form a multilevel-interconnection structure. A via-hole is formed between each of the upper-level interconnections 24c and the upper face of the surface insulating-film 12.

In the other embodiment of the present invention, the via-hole is filled with tungsten (W), and the tungsten overburden in the via-hole is removed by planarizing the upper face of the surface insulating-film 12 by CMP to form the tungsten plug 100. When the via-hole is filled with tungsten (W) to form the tungsten plug 100, it is easy to make flat of the upper surface the surface insulating-film 12 by CMP. On the planarized surface of the tungsten plug 100, an under bump metal 52 is provided. On the under bump metal 52, a flat bump pad 53 is provided. On the bump pad 53, a cone bump 50c is provided. In FIG. 16, although a single cone bump 50c is illustrated, a plurality of micro-bumps explained in the above embodiment can be arranged on the bump pad 53. With the structure illustrated in FIG. 16, on the flat bump pad 53, a plurality of micro-bumps each having equal height is easily provided, the height is measured between each tip of the plurality of micro-bumps and the horizontal level arbitrarily set as a criterion.

In this way, the present invention naturally includes various embodiments that are not described hereinabove. Thus, the technical scope of the present invention should be determined only by the special technical feature (STF) defining the invention prescribed by Claims, which are reasonable from the above descriptions.

What is claimed is:

1. A semiconductor device comprising:
   a connecting base including:
      a semiconductor substrate,
      a surface insulating-film having a flat upper face and provided on the semiconductor substrate,
      an interconnection buried in the surface insulating-film, and
      a surface electrode arranged on the upper face of the surface insulating-film and connected to the interconnection;
   a passivation film covering the upper face of the surface insulating-film and the surface electrode, establishing a groove that exposes a central part of the surface electrode at a bottom;
   a barrier-metal film spanning from the bottom of the groove to an upper face of the passivation film so as to cover an area corresponding to the surface electrode in a plane pattern; and
   a plurality of micro-bumps arranged on the barrier-metal film located on the passivation film.

2. The semiconductor device of claim 1, wherein each of the plurality of micro-bumps has a pyramidal or conical shape with a bottom face connected to the barrier-metal film.

3. The semiconductor device of claim 1, wherein a height of each of the plurality of micro-bumps is smaller than a thickness of the passivation film.

4. A stacked package comprising:
   a target base having a bottom face on which a wiring land is arranged;
   a connecting base facing the target base to be electrically connected to the wiring land, the connecting base including:
      a semiconductor substrate,
      a surface insulating-film having a flat upper face and provided on the semiconductor substrate,
      an interconnection buried in the surface insulating-film, and
      a surface electrode arranged on the upper face of the surface insulating-film and connected to the interconnection;
   a passivation film covering the upper face of the surface insulating-film and the surface electrode, establishing a groove that exposes a central part of the surface electrode at a bottom;
   a barrier-metal film spanning from the bottom of the groove to an upper face of the passivation film so as to cover an area corresponding to the surface electrode in a plane pattern; and
   a plurality of micro-bumps arranged on the barrier-metal film located on the passivation film, each of the plurality of micro-bumps having a tip contacting with the wiring land.

5. An external connection mechanism provided between a target base and a connecting base, the target base having a bottom face on which a wiring land is arranged, the connecting base facing the target base and including a semiconductor substrate, a surface insulating-film having a flat upper face and provided on the semiconductor substrate, an interconnection buried in the surface insulating-film, and a surface electrode arranged on the upper face of the surface insulating-film and connected to the interconnection, the surface electrode is configured to be electrically connected to the wiring land, the external connection mechanism comprising:
   a passivation film covering the upper face of the surface insulating-film and the surface electrode, establishing a groove that exposes a central part of the surface electrode at a bottom;
   a barrier-metal film spanning from the bottom of the groove to an upper face of the passivation film so as to cover an area corresponding to the surface electrode in a plane pattern; and
   a plurality of micro-bumps arranged on the barrier-metal film located on the passivation film, each of the plurality of micro-bumps having a tip contacting with the wiring land.

* * * * *